United States Patent
Tseng et al.

(10) Patent No.: US 11,088,054 B2
(45) Date of Patent: Aug. 10, 2021

(54) LEAD FRAME AND METHOD FOR MANUFACTURING THE SAME

(71) Applicant: Advanced Semiconductor Engineering, Inc., Kaohsiung (TW)

(72) Inventors: Chi Sheng Tseng, Kaohsiung (TW); Lu-Ming Lai, Kaohsiung (TW); Ying-Chung Chen, Kaohsiung (TW); Hui-Chung Liu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/570,841

(22) Filed: Sep. 13, 2019

(65) Prior Publication Data

US 2021/0082791 A1  Mar. 18, 2021

(51) Int. Cl.
*H01L 21/48* (2006.01)
*H01L 23/495* (2006.01)

(52) U.S. Cl.
CPC .... *H01L 23/49558* (2013.01); *H01L 21/4828* (2013.01); *H01L 21/4839* (2013.01); *H01L 23/49503* (2013.01)

(58) Field of Classification Search
CPC ......... H01L 23/49503; H01L 23/4952; H01L 21/56; H01L 21/4821; H01L 24/85; H01L 2224/4824; H01L 2224/48247; H01L 23/49558; H01L 21/4839; H01L 21/4828
See application file for complete search history.

(56) References Cited

U.S. PATENT DOCUMENTS

| | | | |
|---|---|---|---|
| 2006/0148127 A1* | 7/2006 | Ong | G01L 19/141 438/106 |
| 2015/0179553 A1* | 6/2015 | Khor | H01L 21/4821 257/676 |
| 2016/0379916 A1* | 12/2016 | Talledo | H01L 24/97 257/676 |

* cited by examiner

*Primary Examiner* — Caridad Everhart
(74) *Attorney, Agent, or Firm* — Foley & Lardner LLP

(57) ABSTRACT

A lead frame includes a die pad having a pad top surface and a pad bottom surface opposite to the top pad surface, a plurality of leads, each having a top lead surface and a bottom lead surface opposite to the top lead surface and disposed around the die pad, and a first molding compound disposed between the die pad and each of the leads. The first molding compound exposes the top pad surface of the die pad by covering a portion of the periphery of the top pad surface of the die pad. A method for manufacturing the lead frame is also disclosed.

17 Claims, 11 Drawing Sheets

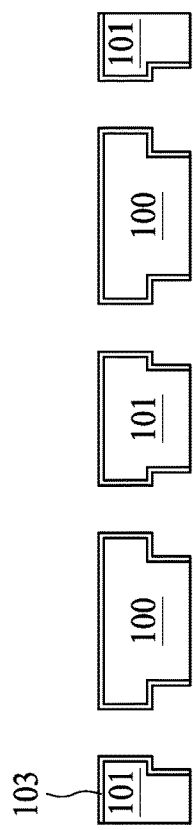
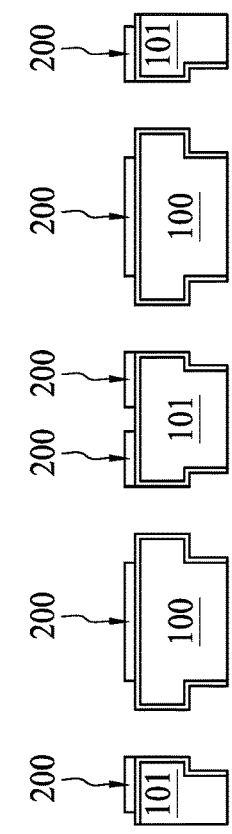
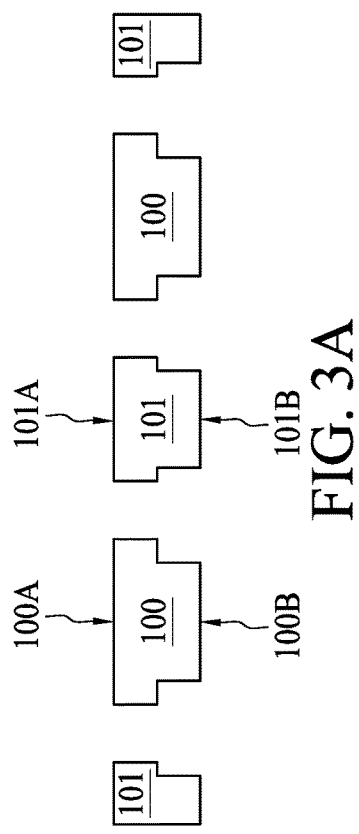
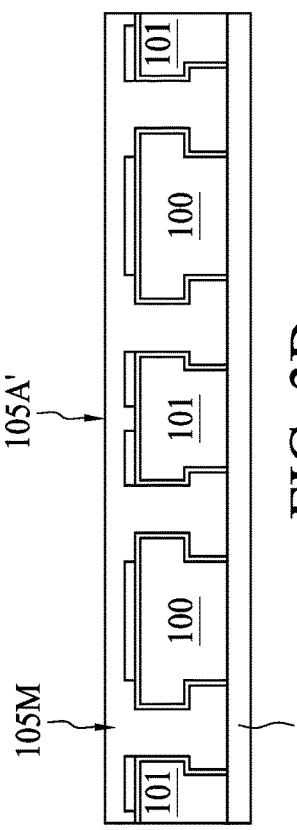
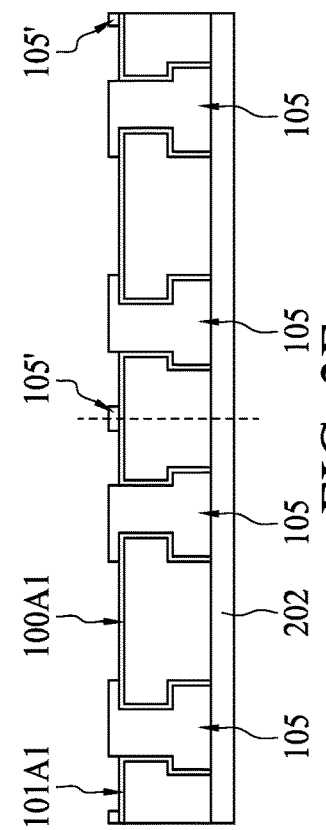
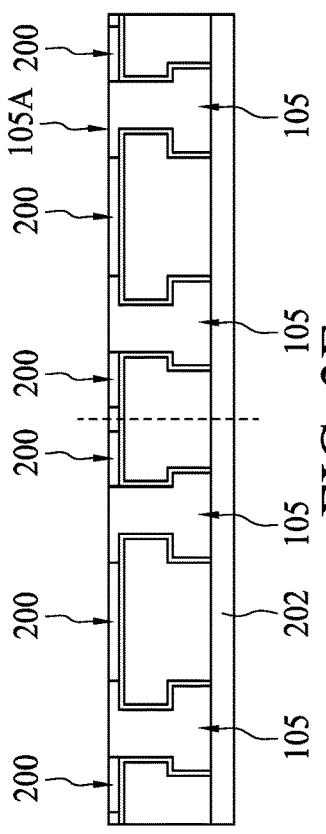

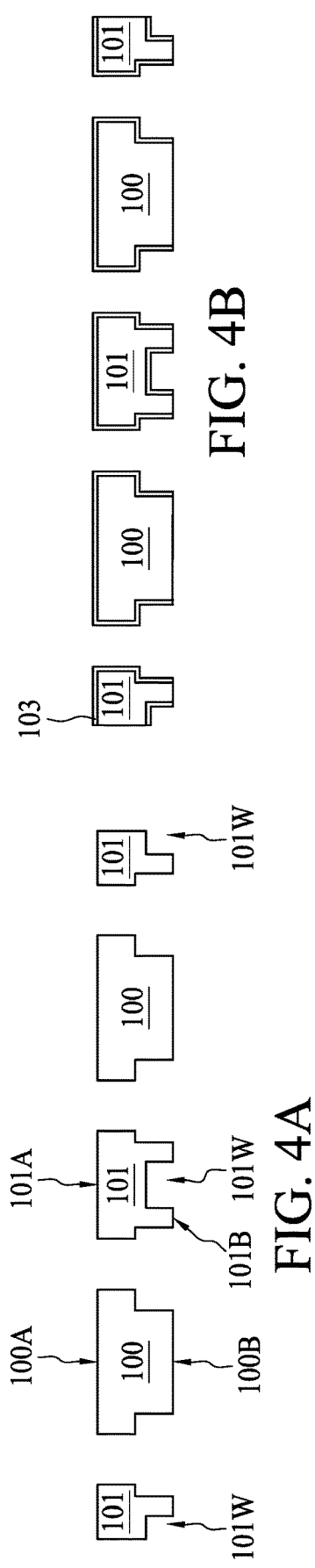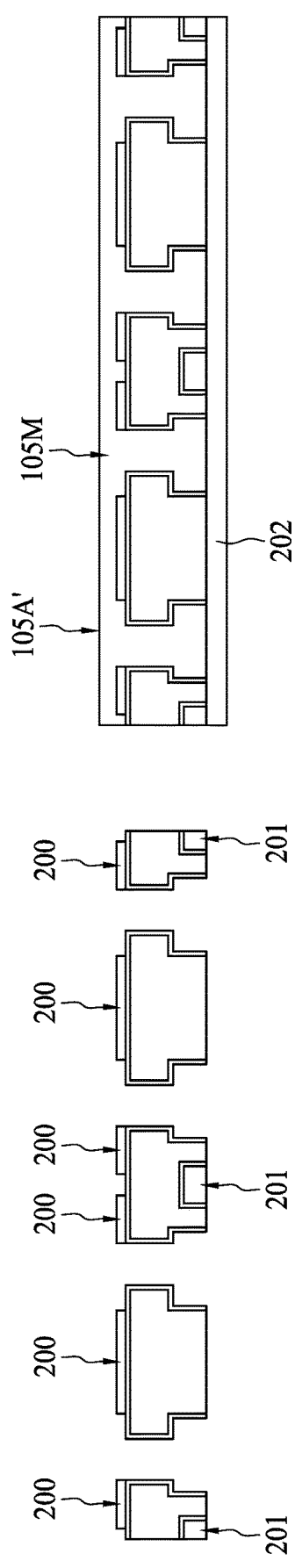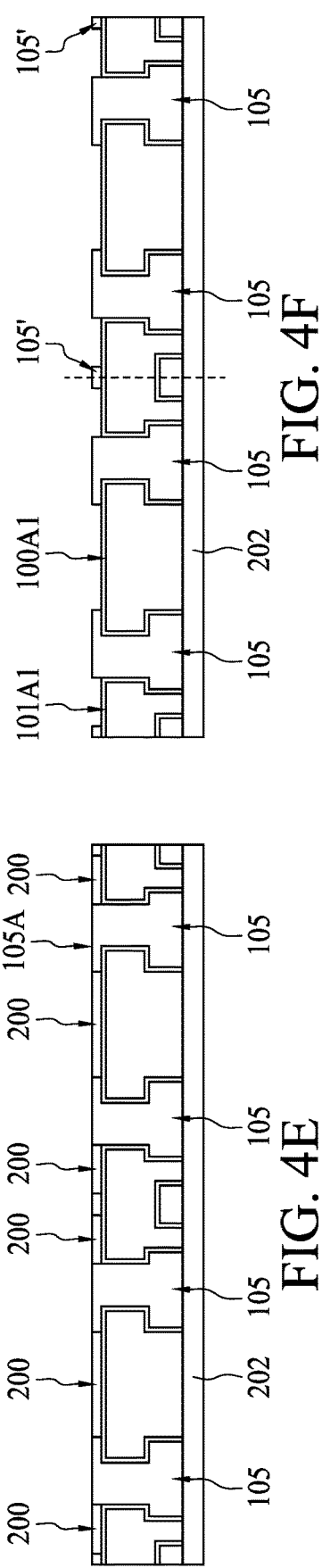

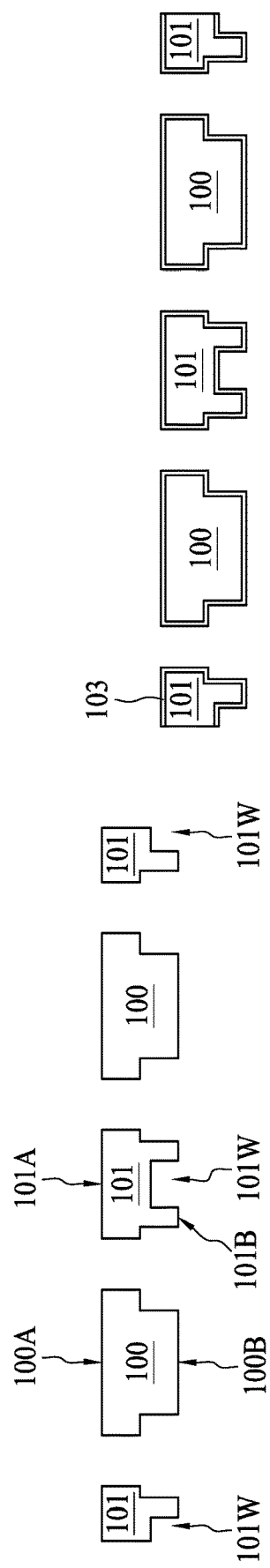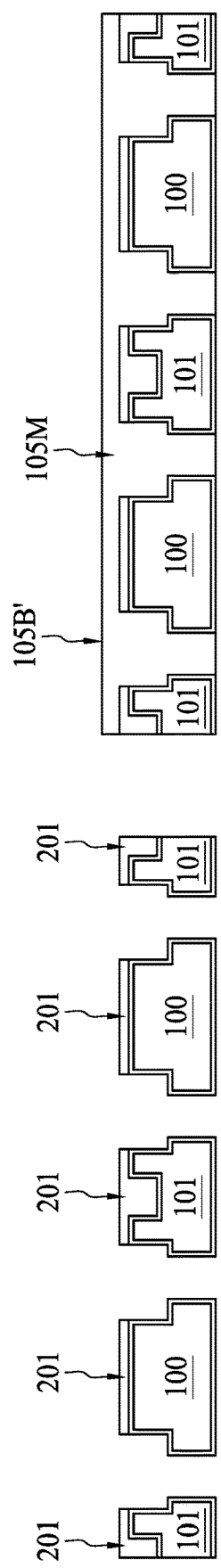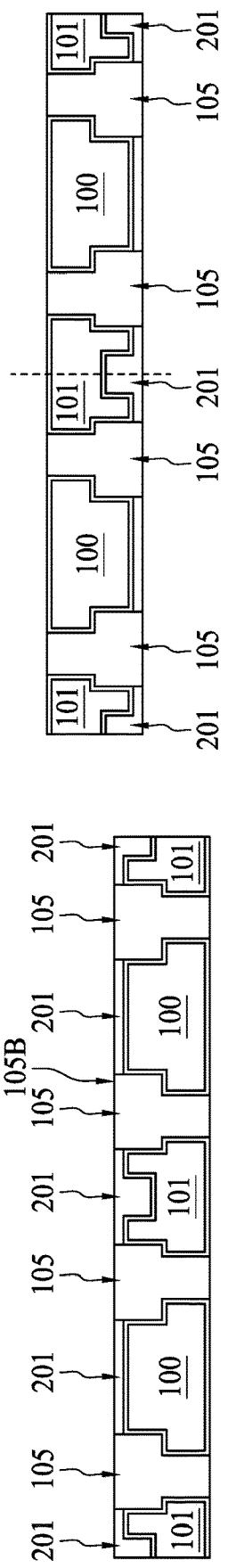

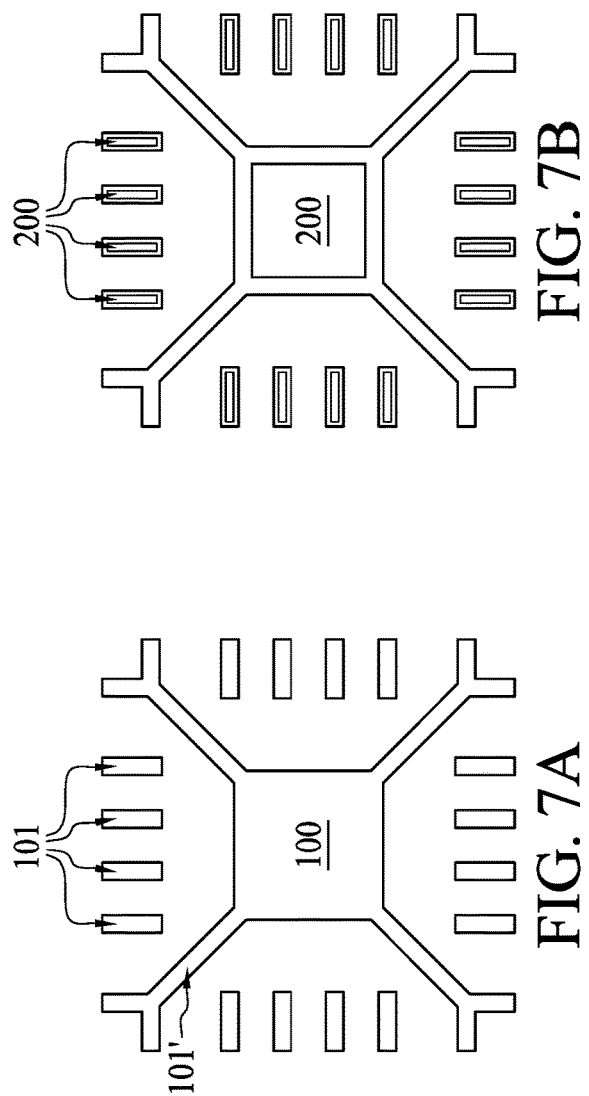
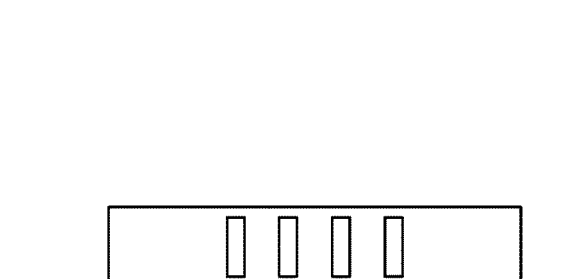
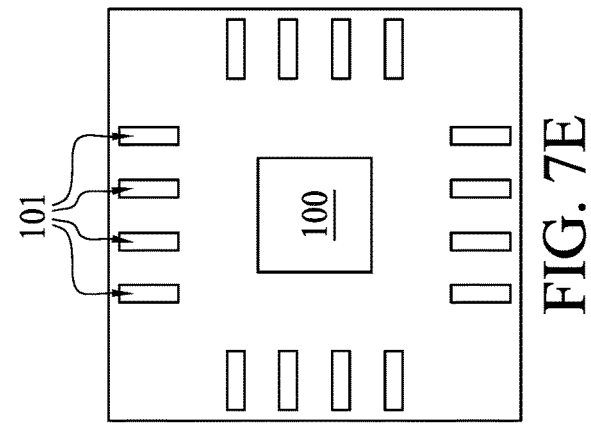
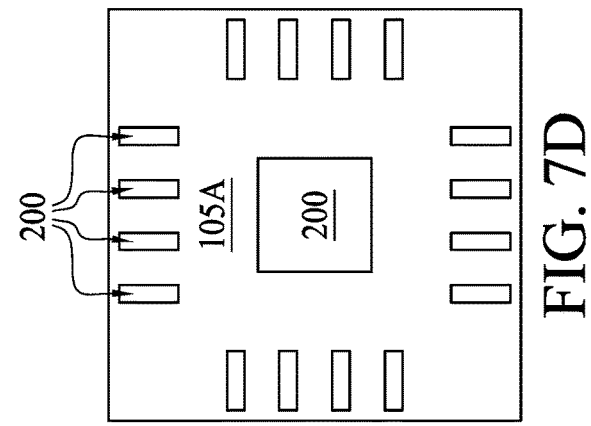

LEAD FRAME AND METHOD FOR MANUFACTURING THE SAME

BACKGROUND

1. Technical Field

The present disclosure relates to a lead frame, particularly to a pre-molded lead frame.

2. Description of the Related Art

There is a demand to provide semiconductor packages which have a very great number of leads but which are also of a very small overall size. One component of a semiconductor package is a lead frame, which is a conductive metal part having a plurality of leads for connecting to the semiconductor chip, such that the leads will extend from the package for connection to a circuit board when the semiconductor device is eventually incorporated into an electronic device. The lead frame will also have one or more joining strips for combining the leads into a unitary structure during the semiconductor manufacturing process.

The two primary methods for producing lead frame are either to stamp the lead frame from a metal ribbon or to use a chemical etching process to etch the lead frame. For large quantities, the chemical etching process is by far the more expensive alternative (given that the marginal cost for lead frames produced by the chemical etching process is much greater, while the fixed cost for tooling dies for the stamping process is quite large).

SUMMARY

In some embodiments, the present disclosure provides a lead frame, including a die pad having a pad top surface and a pad bottom surface opposite to the top pad surface, a plurality of leads, each having a top lead surface and a bottom lead surface opposite to the top lead surface and disposed around the die pad, and a first molding compound disposed between the die pad and each of the leads. The first molding compound exposes the top pad surface of the die pad by covering a portion of the periphery of the top pad surface of the die pad.

In some embodiments, the present disclosure provides a lead frame, including a die pad having a top pad surface and a bottom pad surface opposite to the top pad surface, a plurality of leads disposed around the die pad, each of the leads comprising a top lead surface and a bottom lead surface opposite to the top lead surface, and a first molding compound disposed between the die pad and each of the leads, the first molding compound comprising a top molding surface and a bottom molding surface opposite to the top molding surface. The first molding compound includes an "I" shape from a cross-sectional view by covering a portion of the top die surface and a portion of the top lead surface.

In some embodiments, the present disclosure provides a method for manufacturing a lead frame, including providing a die pad and a plurality of leads around the die pad, disposing a first patterned sacrificial layer over a top pad surface of the die pad and a top lead surface of each of the leads, disposing a molding compound between the die pad and the plurality of leads and over the first patterned sacrificial layer, removing the molding compound until the first patterned sacrificial layer is exposed, and removing the first patterned sacrificial layer over the top pad surface and the top lead surface.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 3A, FIG. 3B, FIG. 3C, FIG. 3D, FIG. 3E, and FIG. 3F illustrate cross sectional views of a lead frame strip or matrix during various manufacturing operations according to some embodiments of the present disclosure.

FIG. 4A, FIG. 4B, FIG. 4C, FIG. 4D, FIG. 4E, and FIG. 4F illustrate cross sectional views of a lead frame strip or matrix during various manufacturing operations according to some embodiments of the present disclosure.

FIG. 5A, FIG. 5B, FIG. 5C, FIG. 5D, FIG. 5E, and FIG. 5F illustrate cross sectional views of a lead frame strip or matrix during various manufacturing operations according to some embodiments of the present disclosure.

FIG. 7A, FIG. 7B, FIG. 7C, FIG. 7D, and FIG. 7E illustrate top views of a single lead frame unit during various manufacturing operations according to some embodiments of the present disclosure.

DETAILED DESCRIPTION

Figure 1A:
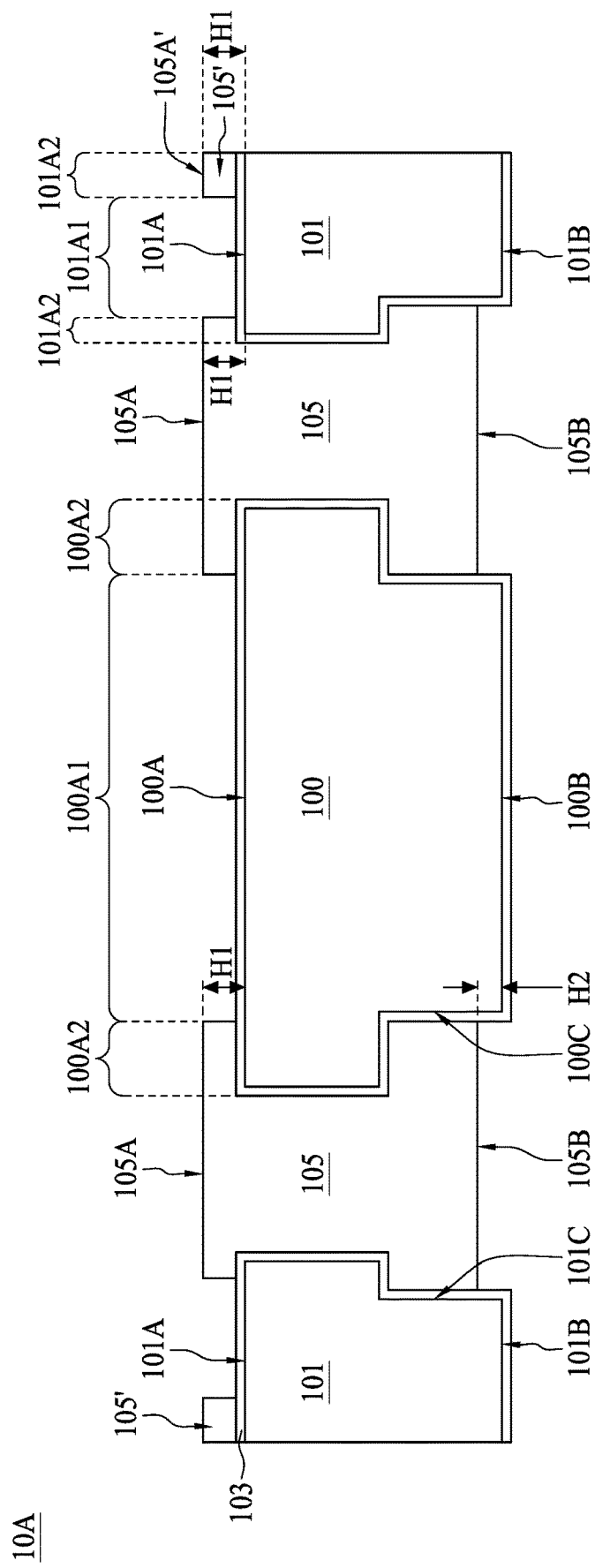
FIG. 1A illustrates a cross-sectional view of a lead frame according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

One type of pre-molded lead frames (PMLF) has a molding sidewall structure on the lead pad surrounding the die pad. The sidewall structure serves the purpose to restrain the glue overflow and to facilitate the application of metal lid or plastic lid over the semiconductor die. However, the molding sidewall structure occupies the working areas, for example, wire bond or die bond region, providing more constraint on the die assembly. In addition, the molding sidewall structure has to be formed by a dedicated mold chase with specific dimensions. When the PMLF design dimension changes or a new PMLF design is available, the mold chase has to be changed or modified, raising the PMLF manufacturing cost.

Another type of the PMLF has a flat surface without molding sidewall structure of its counterpart. Working areas, for example, wire bond or die bond region, can be increased in the flat surface PMLF, yet the molding compound connecting the die pad and the lead pad is prone to delaminate from the metal portion of the PMLF, rendering low product reliability.

Present disclosure provides a PMLF without a molding sidewall structure. The preset PMLF using a plate mold for molding operation, therefore, no modified mold chase is required when the dimension or design has changed. Working area is increased and manufacturing cost reduced. The molding compound of the present PMLF is extended over a peripheral of the die bond region and a peripheral of the wire bond region, providing better handing in PMLF strip form compared to the flat surface PMLF counterpart. Also the thicker molding compound covering periphery of the wire bond and die bond regions serve the purpose of mold-luck, enhancing the PMLF product reliability.

Referring to FIG. 1A, FIG. 1A illustrates a cross-sectional view of a lead frame 10A according to some embodiments of the present disclosure. The lead frame 10A includes a die pad 100 and a plurality of lead pads 101 surrounding the die pad 100. In some embodiments, the die pad 100 is configured to hold a semiconductor die and the lead pads 101 are to be connected with the semiconductor die using wire bonds. The die pad 100 has a top pad surface 100A and a bottom pad surface 100B opposite to the top pad surface 100A. Depending on the designs, the top pad surface 100A is wider than the bottom pad surface 100B, as illustrated, and the top pad surface 100A is the surface receiving the semiconductor die. Each of the lead pads 101 has a top lead surface 101A and a bottom lead surface 101B. Depending on the designs, the top lead surface 101A is wider than the bottom lead surface 101B, as illustrated, and the top lead surface 101A is the surface receiving the wire bond. From a cross sectional view, the die pad 100 is surrounded by two lead pads 101, however, from a top view perspective, as will be addressed in FIG. 6, the die pad 100 can be surrounded by more than two lead pads 101 from all sides of the die pad 10.

A molding compound 105 is positioned between the die pad 100 and lead pads 101, serving as a lead frame structural strengthener. The molding compound 105 fills the space between the die pad 100 and each of the lead pads 101. The molding compound 105 has a top molding surface 105A and a bottom molding surface 105B opposite to the top molding surface 105A. The top molding surface 105A protrudes from the top pad surface 100A by a height difference H1 and extends over a periphery of the top pad surface 100A. On the other hand, the top molding surface 105A protrudes from the top lead surface 101A by a height difference H1 and extends over a periphery of the top lead surface 101A.

In some embodiments, the molding compound 105 surrounds the die pad 100 from all sides of the die pad 100, a covered area 100A2 on the top pad surface 100A of the die pad 100 is encapsulated by the molding compound 105, and an accommodating area 100A1 for the semiconductor die on the top pad surface 100A of the die pad 100 is exposed from the molding compound 105. Alternatively speaking, the molding compound 105 over the top pad surface 100A defines an accommodating area 100A1 of the die pad 100. The accommodating area 100A1 can be smaller than an area of the semiconductor die to be disposed thereon. The conductive glue used for attaching the semiconductor die to the die pad 100 can be confined by the height difference H1 of the molding compound 105 and the top pad surface 100A, and not overflowing to regions outside of the accommodating area 100A1. Moreover, the portion of the molding compound 105 extending over the covered area 100A2 on the top pad surface 100A serves to support the semiconductor die to be attached, and prevent semiconductor die tilt during gluing operation.

As illustrated in FIG. 1A, the molding compound 105 possesses an "I" shape from the cross-sectional perspective. The upper horizontal part of the "I" shape covers the covered area 100A2 of the top pad surface 100A and the covered area 101A2 of the top lead surface 101A, and the lower horizontal part of the "I" shape covers the recessed sidewall 100C connecting the top pad surface 100A and the bottom pad surface 100B as well as the recessed sidewall 101C connecting the top lead surface 101A and the bottom lead surface 101B. In addition to greater thickness of the molding compound 105 compared to comparative flat PMLF, the "I" shape of the molding compound 105 serves the purpose of a mold lock, enhancing the reliability of the present PMLF 10A.

In some embodiments, the molding compound 105 surrounds the lead pad 101 from all sides of the lead pad 101, a covered area 101A2 on the top lead surface 101A of the lead pad 101 is encapsulated by the molding compound 105, and an accommodating area 101A1 for wire bonding is exposed from the molding compound 105. Note another molding compound 105' is positioned over a periphery of the lead pad 101. In some embodiments, the molding compound 105' may have a sidewall coplanar with a sidewall of the lead pad 101. Alternatively speaking, the molding compound 105 and the molding compound 105' over the top lead surface 101A defines an accommodating area 101A1 of the lead pad 101. Depending on the area that wire bond specifies on the top lead surface 101A, the coverage of the molding compound 105 and the molding compound 105' can be adjusted accordingly. The portion of the molding compound 105 and the molding compound 105' over the covered area 101A2 of the top lead surface 101A strengthen the structural robustness of the lead frame 10A. In some embodiments, the molding compound 105 has a height difference H1 between top molding surface 105A and the top lead surface 101A, and the molding compound 105' has a substantially identical height difference H1 between top molding surface 105A' and the top lead surface 101A.

In some embodiments, the bottom molding surface 105B of the molding compound 105 and the bottom pad surface 100B has a height difference H2 as a result of tape release after molding operation, as will be described in FIG. 2A of the present disclosure.

In some embodiments, a pre-plated frame (PPF) finish 103 is formed over the top pad surface 100A, the bottom pad surface 100B, the top lead surface 101A, and the bottom lead surface 101B. In some embodiments, ultrathin film of nickel-palladium-gold is used for the PPF finish 103 of the semiconductor lead frame. Moreover, the PPF finish 103 is also formed on the side surface connecting the top pad surface 100A and the bottom pad surface 100B, and on the side surface connecting the top lead surface 101A and the bottom lead surface 101B. In other words, the PPF finish 103 can be observed between the molding compound 105 and the die pad 100, and between the molding compound 105 and each of the lead pads 101. In some embodiments, additional Ag plating is formed over the aforesaid surfaces to facilitate wire bonding.

Figure 1B:
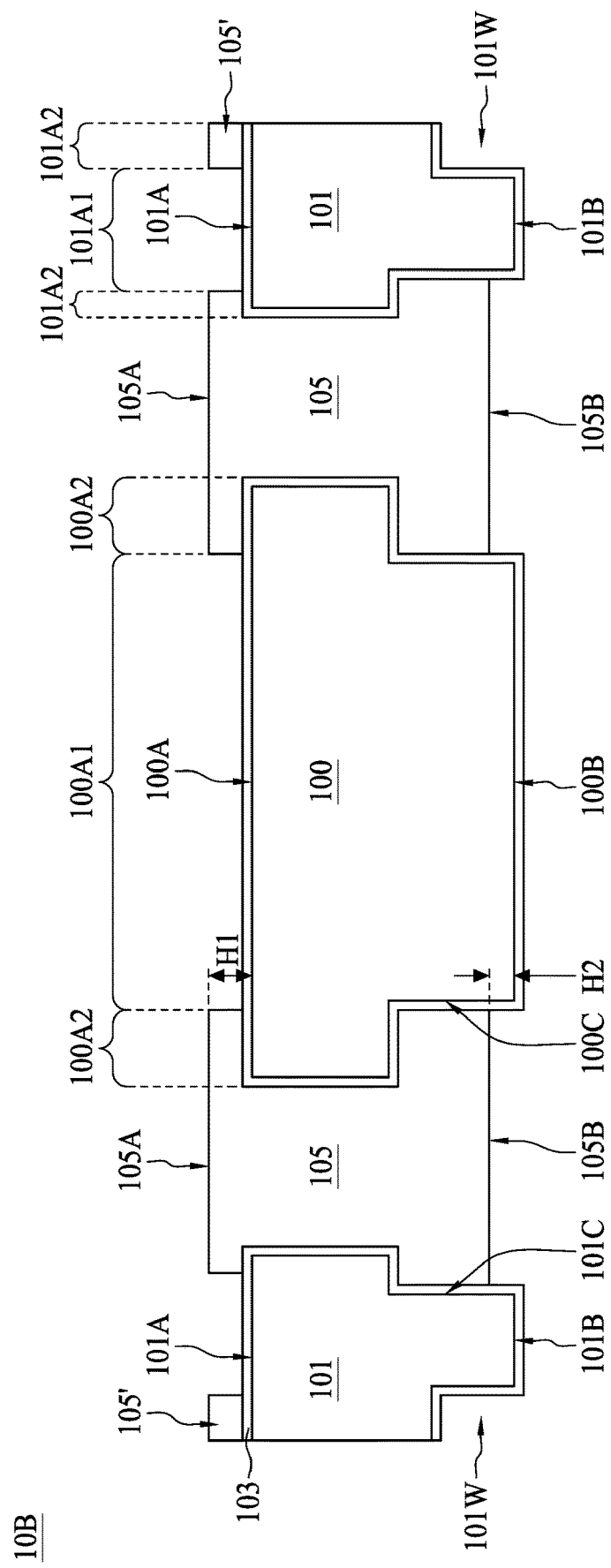
FIG. 1B illustrates a cross-sectional view of a lead frame according to some embodiments of the present disclosure.

Referring to FIG. 1B, FIG. 1B illustrates a cross-sectional view of a lead frame 10B according to some embodiments of the present disclosure. The lead frame 10B is similar to the lead frame 10A except that an additional notch 101W is formed at a corner of each of the plurality of lead pads 101. The PPF finish is coated on the surface of the notch 101W. The notch 101W can be used to provide better wettability to solder materials that are often used in automobile-related electronic applications. In some embodiments, sacrificial layers are filled in the notch 101W prior to bonding the PMLF 10B to a ceramic substrate, for example.

As illustrated in FIG. 1B, the molding compound 105 possesses an "I" shape from the cross-sectional perspective. The upper horizontal part of the "I" shape covers the covered area 100A2 of the top pad surface 100A and the covered area 101A2 of the top lead surface 101A, and the lower horizontal part of the "I" shape covers the recessed sidewall 100C connecting the top pad surface 100A and the bottom pad surface 100B as well as the recessed sidewall 101C connecting the top lead surface 101A and the bottom lead surface 101B. In addition to greater thickness of the molding compound 105 compared to comparative flat PMLF, the "I" shape of the molding compound 105 serves the purpose of a mold lock, enhancing the reliability of the present PMLF 10B.

Figure 1C:
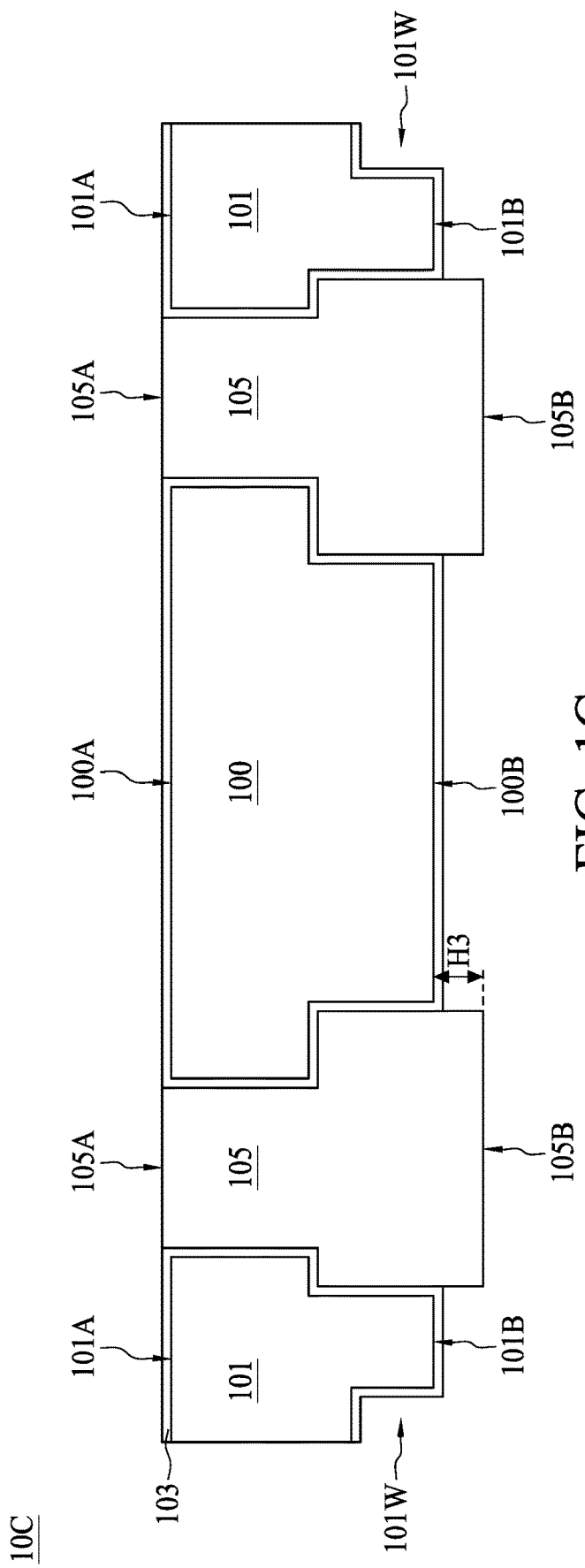
FIG. 1C illustrates a cross-sectional view of a lead frame according to some embodiments of the present disclosure.

FIG. 1C illustrates a cross-sectional view of a lead frame 10C according to some embodiments of the present disclosure. The lead frame 10C is similar to the lead frame 10B except that the top molding surface 105A is substantially coplanar with the top pad surface 100A and the top lead surface 101A, and that the bottom molding surface 105B protrudes from the bottom pad surface 100B and the bottom lead surface 101B by a height difference H3 as a result of the removal of the patterned sacrificial layer over the bottom pad surface 100B and the bottom lead surface 101B. An additional notch 101W is formed at a corner of each of the plurality of lead pads 101. The PPF finish is coated on the surface of the notch 101W. The notch 101W can be used to provide better wettability to solder materials that are often used in automobile-related electronic applications. In some embodiments, sacrificial layers are filled in the notch 101W prior to bonding the PMLF 10C to a ceramic substrate, for example, as will be further described in FIG. 2C.

Figure 2A:
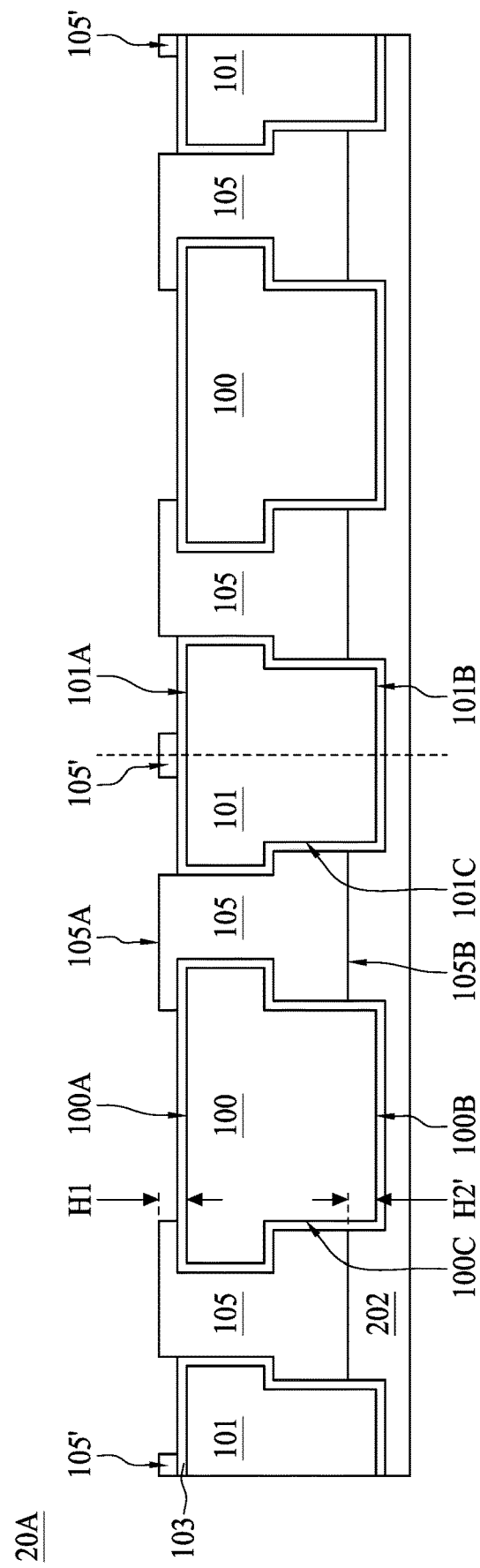
FIG. 2A illustrates a cross-sectional view of a lead frame strip or matrix according to some embodiments of the present disclosure.

Referring to FIG. 2A, FIG. 2A illustrates a cross-sectional view of a lead frame strip or matrix 20A according to some embodiments of the present disclosure. The lead frame strip or matrix 20A shows a stage before lead frame singulation, for example, a singulation site is labeled with dotted lines over one of the lead pads 101. A tape 202 attached to the bottom pad surface 100B, the bottom lead surface 101B, and the bottom molding surface 105B will be removed after the lead frame singulation. As illustrated in FIG. 2A, since the tape 202 is composed of deformable materials such as polymeric materials, a portion of the tape 202 may be deformed so as to extend toward the top pad surface 100A and the top lead surface 101A by a height difference H2' prior to the injection of molding compound 105. After the tape 202 is removed, the bottom molding surface 105B and the bottom pad surface 100B leaves a height difference H2 as previously illustrated in FIG. 1A.

Figure 2B:
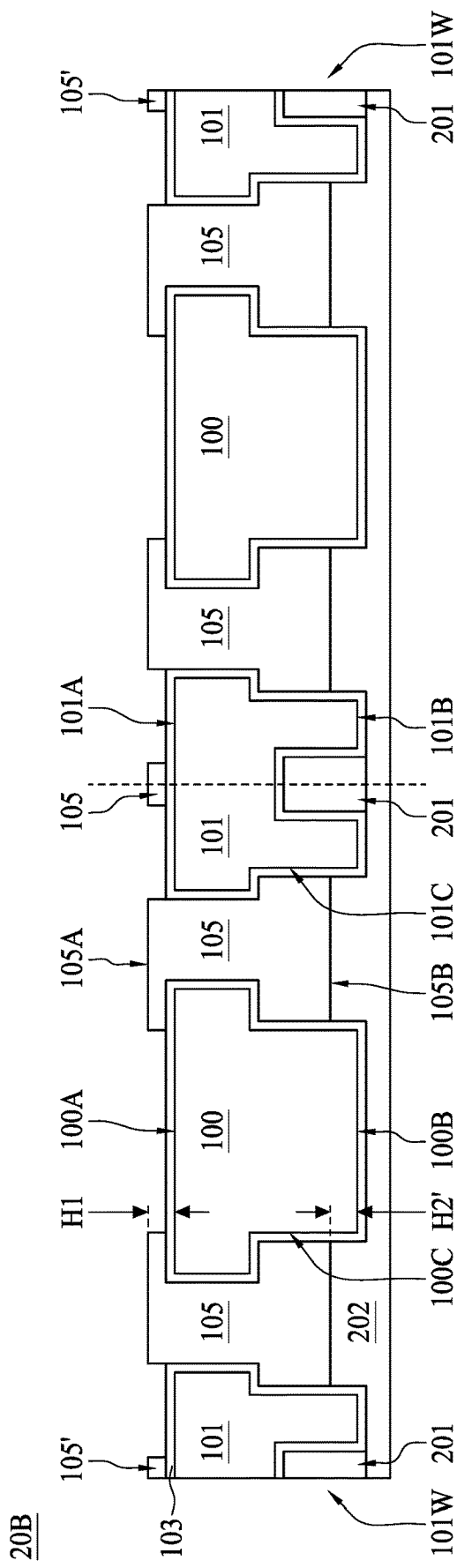
FIG. 2B illustrates a cross-sectional view of a lead frame strip or matrix according to some embodiments of the present disclosure.

Referring to FIG. 2B, FIG. 2B illustrates a cross-sectional view of a lead frame strip or matrix 20B according to some embodiments of the present disclosure. The lead frame strip or matrix 20B shows a stage before lead frame singulation, for example, a singulation site is labeled with dotted lines over one of the lead pads 101. A tape 202 attached to the bottom pad surface 100B, the bottom lead surface 101B, and the bottom molding surface 105B will be removed after the lead frame singulation. As illustrated in FIG. 2B, since the tape 202 is composed of deformable materials such as polymeric materials, a portion of the tape 202 may be deformed so as to extend toward the top pad surface 100A and the top lead surface 101A by a height difference H2' prior to the injection of molding compound 105. After the tape 202 is removed, the bottom molding surface 105B and the bottom pad surface 100B leaves a height difference H2 as previously illustrated in FIG. 1B. Also note that a notch 101W filled with patterned sacrificial materials 201 is applied prior to the tape 202 application. Although not illustrated in FIG. 2B, in some embodiments, in addition to deform along the recessed sidewalls 100C, 101C of the die pad 100 and the lead pad 101, the tape 202 may deform along the sidewall of the notch 101W, so as to render a height difference (not shown) between the bottom of the patterned sacrificial materials 201 and the bottom lead surface 101B after tape 202 removal.

Figure 2C:
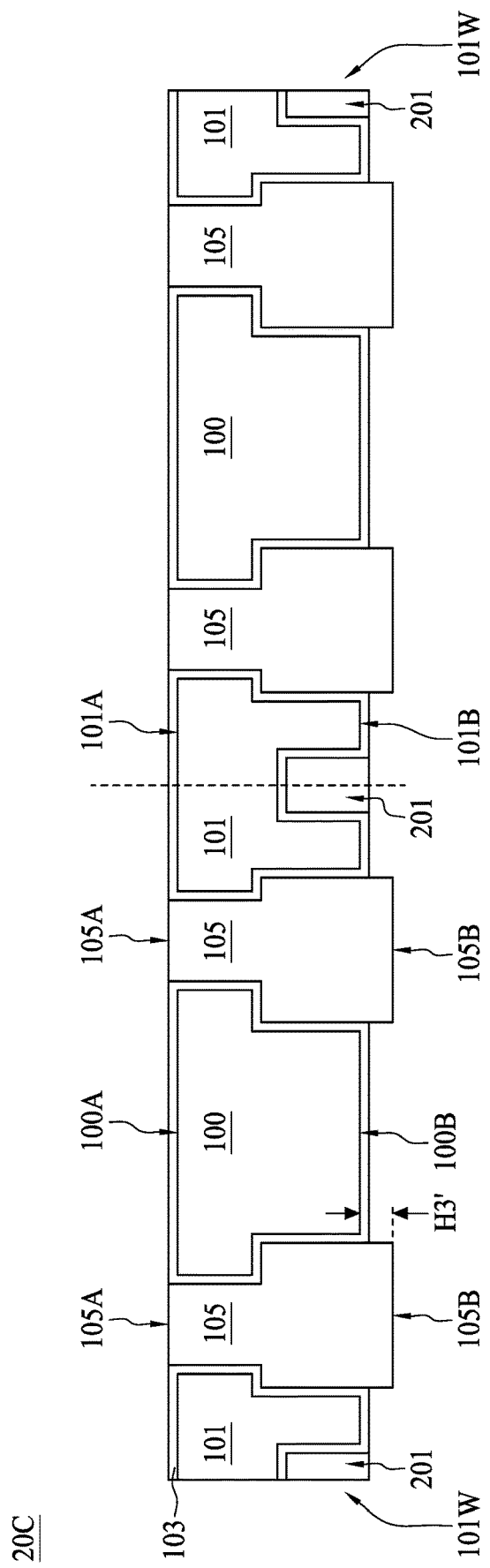
FIG. 2C illustrates a cross-sectional view of a lead frame strip or matrix according to some embodiments of the present disclosure.

Referring to FIG. 2C, FIG. 2C illustrates a cross-sectional view of a lead frame strip or matrix 20C according to some embodiments of the present disclosure. The lead frame strip or matrix 20C shows a stage before lead frame singulation, for example, a singulation site is labeled with dotted lines over one of the lead pads 101. No tape is applied over the bottom pad surface 100B or bottom lead surface 101B prior to singulation. As shown in FIG. 2C, the bottom molding surface 105B protrudes from the bottom pad surface 100B or the bottom lead surface 101B by a height difference H3'. The height difference H3' is associated with a thickness of the patterned sacrificial material 201 applied over the bottom pad surface 100B and the bottom lead surface 101 prior to molding operation. The patterned sacrificial material 201 may also fill into one or more of the notches 101W on the corner of the lead pads 101. In some embodiments, the height difference H3' between the bottom molding surface 105B and the bottom pad surface 100B is substantially identical to a thickness of the patterned sacrificial material 201 applied over the bottom pad surface 100B.

FIG. 3A to FIG. 3F illustrate cross sectional views of a lead frame strip or matrix during various manufacturing operations according to some embodiments of the present disclosure. In FIG. 3A, a copper plate is etched with lead frame pattern including die pads 100 and lead pads 101. A die pad 100 can be surrounded by a plurality of lead pads 101. As previously described, the top pad surface 100A is wider than the bottom pad surface 100B, and the top lead surface 101A is wider than the bottom lead surface 101B after the etching operation. In FIG. 3B, a PPF finish 103 is plated over the top pad surface 100A, the bottom pad surface 100B, the top lead surface 101A, the bottom lead surface 101B, and the sidewalls connecting the above surfaces. Optionally, Ag film is plated over the aforesaid surfaces to facilitate wire bonding.

In FIG. 3C, a patterned sacrificial layer 200 is formed over the top pad surface 100A of the die pad 100 and the top lead surface 101A of the lead pad 101. In some embodiments, the patterned sacrificial layer 200 covers a center portion of the die pad 101. In some embodiments, the patterned sacrificial layer 200 covers a portion of the lead pad 101 and exposes another portion of the lead pad 101 prior to the singulation operation. In some embodiments, the patterned sacrificial layer 200 covers a die bond region and a wire bond region designed for the lead frame. In some embodiments, the patterned sacrificial layer 200 can be composed of patternable materials such as photoresist. In some embodiments, the patterned sacrificial layer 200 can be applied by stencil printing or screen printing. A curing operation or a soft bake operation may be performed following the formation of the patterned sacrificial layer 200.

In FIG. 3D, a tape 202 is attached to the bottom pad surface 100B and the bottom lead surface 101B, followed by, for example, an over molding operation encapsulating the die pads 100 and the lead pads 101. After the molding operation, the top pad surface 100A, the top lead surface 101A, and the patterned sacrificial layer 200 are covered by the molding compound 105M. The molding compound 105M has a top surface 105A' higher than a top surface of the patterned sacrificial layer 200. The tape 202 is applied to prevent molding compound 105M from overflowing to the bottom pad surface 100B and/or the bottom lead surface 101B. As previously described, a portion of the tape 202 may be deformed so as to extend toward the top pad surface 100A and the top lead surface 101A by a height difference H2' (not shown in FIG. 3D) prior to the injection of molding compound 105M.

In FIG. 3E, the molding compound 105A' is grinded to an extent that a top surface of the patterned sacrificial layer 200 is exposed. Molding compound 105 with a molding surface 105A substantially coplanar with the top surface of the patterned sacrificial layer 200 is obtained after the grinding operation. In some embodiments, the grinding operation continues to thin down the molding compound 105A' to ensure the complete exposure of the patterned sacrificial layer 200. In FIG. 3F, the exposed patterned sacrificial layer 200 is removed by suitable cleaning operations, thereby exposing the accommodating area 100A1 on the top pad surface 100A and the accommodating area 101A1 on the top lead surface 101A. Note the molding compound 105 defines the accommodating area 100A1, and the molding compound 105 together with molding compound 105' define the accommodating area 101A1.

FIG. 4A to FIG. 4F illustrate cross sectional views of a lead frame strip or matrix during various manufacturing operations according to some embodiments of the present disclosure. In FIG. 4A, a copper plate is etched with lead frame pattern including die pads 100 and lead pads 101. A die pad 100 can be surrounded by a plurality of lead pads 101. As previously described, the top pad surface 100A is wider than the bottom pad surface 100B, and the top lead surface 101A is wider than the bottom lead surface 101B after the etching operation. As shown in FIG. 4A, a notch 101W is formed, for example, by the etching operation, at a corner of the lead pad 101 or a bottom lead surface 101B. In FIG. 4B, a PPF finish 103 is plated over the top pad surface 100A, the bottom pad surface 100B, the top lead surface 101A, the bottom lead surface 101B, the sidewalls connecting the above surfaces, and the notch 101W. Optionally, Ag film is plated over the aforesaid surfaces to facilitate wire bonding.

In FIG. 4C, a patterned sacrificial layer 200 is formed over the top pad surface 100A of the die pad 100 and the top lead surface 101A of the lead pad 101. In some embodiments, the patterned sacrificial layer 200 covers a center portion of the die pad 101. In some embodiments, the patterned sacrificial layer 200 covers a portion of the lead pad 101 and exposes another portion of the lead pad 101 prior to the singulation operation. In some embodiments, the patterned sacrificial layer 200 covers a die bond region and a wire bond region designed for the lead frame. In some embodiments, the patterned sacrificial layer 200 can be composed of patternable materials such as photoresist. In some embodiments, the patterned sacrificial layer 200 can be applied by stencil printing or screen printing. A curing operation or a soft bake operation may be performed following the formation of the patterned sacrificial layer 200. Subsequently, a patterned sacrificial layer 201 is formed in the notch 101W on the bottom lead surface 101B of the lead pad 101. In some embodiments, the patterned sacrificial layer 201 can be composed of patternable materials such as photoresist. In some embodiments, the patterned sacrificial layer 201 can be applied by stencil printing or screen printing. A curing operation or a soft bake operation may be performed following the formation of the patterned sacrificial layer 201.

In FIG. 4D, a tape 202 is attached to the bottom pad surface 100B, the bottom lead surface 101B, and the patterned sacrificial layer 201, followed by, for example, an over molding operation encapsulating the die pads 100 and the lead pads 101. After the molding operation, the top pad surface 100A, the top lead surface 101A, and the patterned sacrificial layer 200 are covered by the molding compound 105M. The molding compound 105M has a top surface 105A' higher than a top surface of the patterned sacrificial layer 200. The tape 202 is applied to prevent molding compound 105M from overflowing to the bottom pad surface 100B and/or the bottom lead surface 101B. As previously described, a portion of the tape 202 may be deformed so as to extend toward the top pad surface 100A and the top lead surface 101A by a height difference H2' (not shown in FIG. 4D) prior to the injection of molding compound 105M.

In FIG. 4E, the molding compound 105A' is grinded to an extent that a top surface of the patterned sacrificial layer 200 is exposed. Molding compound 105 with a molding surface 105A substantially coplanar with the top surface of the patterned sacrificial layer 200 is obtained after the grinding operation. In some embodiments, the grinding operation continues to thin down the molding compound 105A' to ensure the complete exposure of the patterned sacrificial layer 200. In FIG. 4F, the exposed patterned sacrificial layer 200 is removed by suitable cleaning operations, thereby exposing the accommodating area 100A1 on the top pad surface 100A and the accommodating area 101A1 on the top lead surface 101A. Note the molding compound 105 defines the accommodating area 100A1, and the molding compound 105 together with molding compound 105' define the accommodating area 101A1.

Subsequent to FIG. 4F, a semiconductor die (not shown) can be attached to the accommodating area 100A1 of the top pad surface 100A and the lead frame strip or matrix can be singulated along singulation site (dotted lines). The patterned sacrificial layer 201 filling the notch 101W prevent the metal burr formation during singulation operation. After the lead frame singulation, the patterned sacrificial layer 201 can be removed from the notch 101W. For automobile-related electronic applications, solder paste is then applied to fill the notch 101W and bond the lead frame with semiconductor die to another carrier.

FIG. 5A to FIG. 5F illustrate cross sectional views of a lead frame strip or matrix during various manufacturing operations according to some embodiments of the present disclosure. In FIG. 5A, a copper plate is etched with lead frame pattern including die pads 100 and lead pads 101. A die pad 100 can be surrounded by a plurality of lead pads 101. As previously described, the top pad surface 100A is wider than the bottom pad surface 100B, and the top lead surface 101A is wider than the bottom lead surface 101B after the etching operation. As shown in FIG. 5A, a notch 101W is formed, for example, by the etching operation, at a corner of the lead pad 101 or a bottom lead surface 101B. In FIG. 5B, a PPF finish 103 is plated over the top pad surface 100A, the bottom pad surface 100B, the top lead surface 101A, the bottom lead surface 101B, the sidewalls connecting the above surfaces, and the notch 101W. Optionally, Ag film is plated over the aforesaid surfaces to facilitate wire bonding.

In FIG. 5C, the lead frame is flipped upside-down and a patterned sacrificial layer 201 is formed over the in the notch 101W on the bottom lead surface 101B of the lead pad 101. In some embodiments, the patterned sacrificial layer 201 can be composed of patternable materials such as photoresist. In some embodiments, the patterned sacrificial layer 201 can be applied by stencil printing or screen printing. A curing operation or a soft bake operation may be performed following the formation of the patterned sacrificial layer 201. In some embodiments, the patterned sacrificial layer 201 is also applied on the bottom pad surface 100B and the bottom lead surface 101B. In some embodiments, the patterned sacrificial layer 201 completely covers the bottom pad surface 100B and the bottom lead surface 101B.

In FIG. 5D, an over molding operation encapsulating the die pads 100 and the lead pads 101 from the bottom pad surface 100B and the bottom lead surface 101B. After the molding operation, the bottom pad surface 100B, the bottom lead surface 101B, and the patterned sacrificial layer 201 are covered by the molding compound 105M. The molding compound 105M has a top surface 105З higher than a top surface of the patterned sacrificial layer 201.

In FIG. 5E, the molding compound 105B' is grinded to an extent that a top surface of the patterned sacrificial layer 201 is exposed. Molding compound 105 with a molding surface 105B substantially coplanar with the surface of the patterned sacrificial layer 201 is obtained after the grinding operation. In some embodiments, the grinding operation continues to thin down the molding compound 105A' to ensure the complete exposure of the patterned sacrificial layer 201. In FIG. 5F, the lead frame is again flipped upside-down to obtain a flat profile on the top pad surface 100A and the top lead surface 101A, while having a patterned sacrificial layer 201 filling the notches 101W and disposed over the bottom pad surface 100B and the bottom lead surface 101B.

Subsequent to FIG. 5F, a semiconductor die (not shown) can be attached to the top pad surface 100A and the lead frame strip or matrix can be singulated along singulation site (dotted lines). The patterned sacrificial layer 201 filling the notch 101W prevent the metal burr formation during singulation operation. After the lead frame singulation, the patterned sacrificial layer 201 can be removed from the notch 101W. For automobile-related electronic applications, solder paste is then applied to fill the notch 101W and bond the lead frame with semiconductor die to another carrier.

Figure 6:
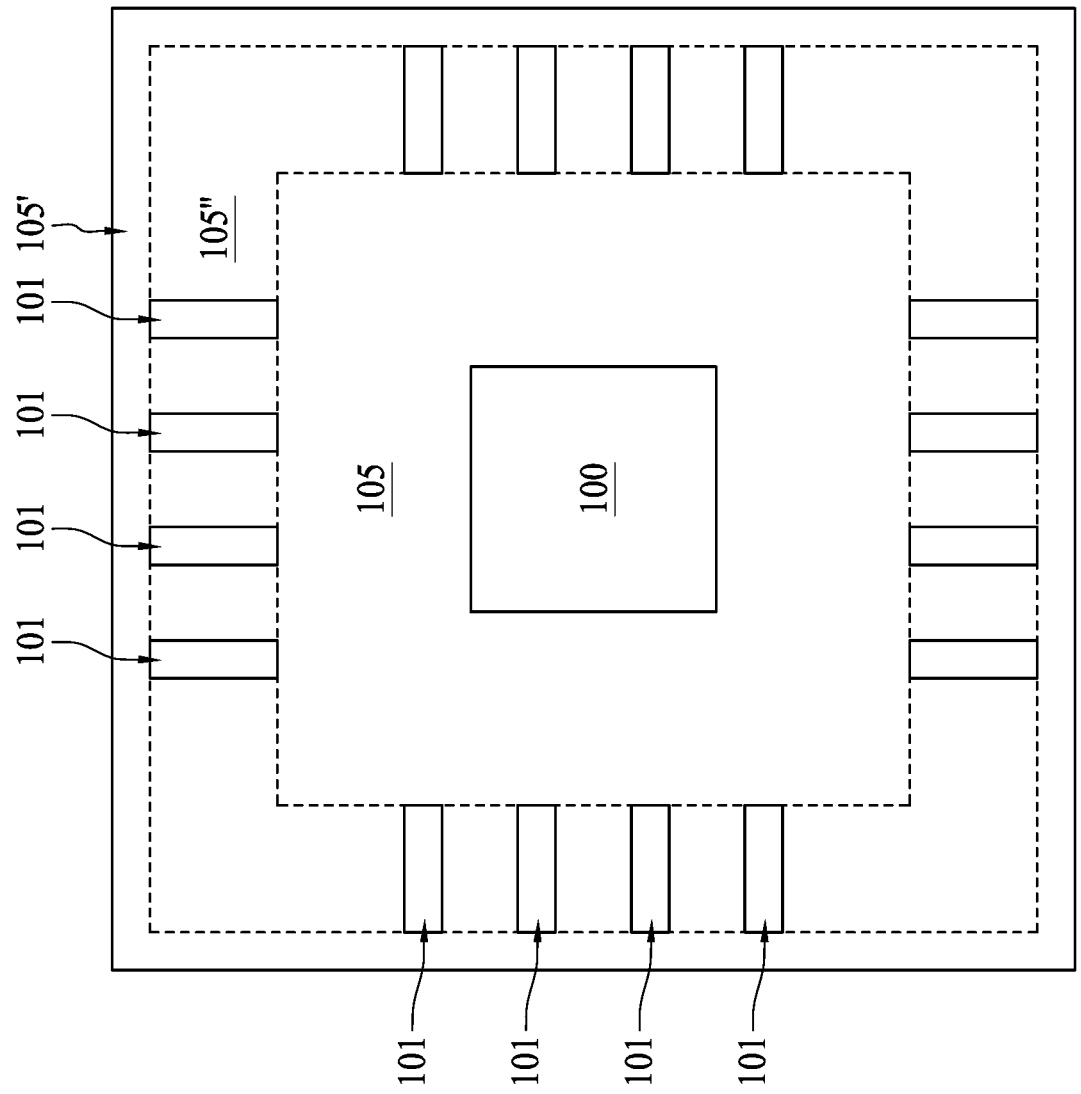
FIG. 6 illustrates a top view of a lead frame according to some embodiments of the present disclosure.

FIG. 6 illustrates a top view of a lead frame according to some embodiments of the present disclosure. Referring to FIG. 1A and FIG. 6, the die pad 100 is surrounded by a plurality of lead pads 101 from, for example, four sides of the die pad 100. Molding compound 105 covers a periphery of the die pad 100 and a periphery of the lead pad 101 close to the die pad 100. Molding compound 105' covers a periphery of the lead pad 101 away from the die pad 100. From a top view perspective, molding compound 105 and molding compound 105' is connected by molding compound 105", which also covers a portion of the periphery of the lead pads 101.

FIG. 7A to FIG. 7E illustrate top views of a single lead frame unit during various manufacturing operations according to some embodiments of the present disclosure. In FIG. 7A, a die pad 100, a lead pad 101, a support lead 101' is formed by etching a copper plate. In FIG. 7B, patterned sacrificial layer 200 is formed to cover a center portion of the die pad 100 and a portion of the lead pad 200. In FIG. 7C, molding compound 105A' is applied over the patterned sacrificial layer 200 and encapsulating the entire lead frame unit. In FIG. 7D, molding compound 105A' is grinded to expose the patterned sacrificial layer 200 and kept the die pad 100 and lead pads 101 under coverage. In FIG. 7E, the patterned sacrificial layer 200 is removed to expose a portion of the die pad 100 and lead pads 101. Locations of molding compound 105 and molding compound 105' are illustrated and described in FIG. 6 and FIG. 1A and can be referred thereto.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A lead frame, comprising:
a die pad, having a top pad surface and a bottom pad surface opposite to the top pad surface;
a plurality of leads, each having a top lead surface and a bottom lead surface opposite to the top lead surface and disposed around the die pad;
a first molding compound disposed between the die pad and each of the leads, wherein the first molding compound exposes the top pad surface of the die pad by covering a portion of the periphery of the top pad surface of the die pad; and
a second molding compound disposed adjacent to the top lead surface, wherein the second molding compound and the first molding compound define a second accommodating area over the top lead surface.

2. The lead frame of claim 1, wherein the first molding compound defines a first accommodating area over the top pad surface of the die pad.

3. The lead frame of claim 1, wherein the top pad surface of the die pad is larger than the bottom pad surface of the die pad and the first molding compound fills the space between the die pad and each of the leads.

4. The lead frame of claim 1, wherein the top pad surface of the die pad is larger than the bottom pad surface of the die pad, the top lead surface is larger than the bottom lead surface, and the first molding compound fills the space between the die pad and each of the leads.

5. The lead frame of claim 1, wherein the first molding compound exposes the top lead surface by covering a portion of the top lead surface.

6. The lead frame of claim 5, wherein the top lead surface is larger than the bottom lead surface, and the first molding compound fills the space between the die pad and each of the leads.

7. The lead frame of claim 1, wherein each of the leads comprises a notch at the bottom lead surface, and wherein a patterned sacrificial layer is disposed in the notch.

8. The lead frame of claim 1, wherein the first molding compound comprises a top molding surface and a bottom molding surface opposite to the top molding surface, further comprising a height difference between the top molding surface and the top pad surface.

9. The lead frame of claim 8, further comprising a height difference between the bottom molding surface and the bottom pad surface.

10. A lead frame, comprising:
a die pad, having a top pad surface and a bottom pad surface opposite to the top pad surface;
a plurality of leads disposed around the die pad, each of the leads comprising a top lead surface and a bottom lead surface opposite to the top lead surface; and
a first molding compound disposed between the die pad and each of the leads, the first molding compound comprising a top molding surface and a bottom molding surface opposite to the top molding surface,
wherein the first molding compound comprises an "I" shape from a cross-sectional view by covering a portion of the top die surface and a portion of the top lead surface, and a height difference between the top molding surface and the top pad surface.

11. The lead frame of claim 10, further comprising a height difference between the bottom molding surface and the bottom pad surface.

12. The lead frame of claim 10, wherein the first molding compound defines a first accommodating area over the top pad surface by covering a periphery of the top pad surface.

13. The lead frame of claim 10, further comprising a second molding compound disposed adjacent to a top lead surface of each of the leads, wherein the second molding compound and the first molding compound define a second accommodating area over the top lead surface.

14. The lead frame of claim 13, wherein the second molding compound covers a periphery of the top lead surface.

15. A method for manufacturing a lead frame, comprising:
providing a die pad and a plurality of leads around the die pad;
disposing a first patterned sacrificial layer over a top pad surface of the die pad and a top lead surface of each of the leads;
disposing a molding compound between the die pad and the plurality of leads and over the first patterned sacrificial layer;
removing the molding compound until the first patterned sacrificial layer is exposed;
removing the first patterned sacrificial layer over the top pad surface and the top lead surface; and
disposing a second patterned sacrificial layer in a notch at a bottom lead surface of each of the leads.

16. The method of claim 15, wherein disposing the first patterned sacrificial layer comprises performing a printing operation.

17. The method of claim 15, further comprising attaching a tape on a bottom lead surface and a bottom pad surface prior to disposing the molding compound.

* * * * *